United States Patent
Koo et al.

(10) Patent No.: US 12,207,572 B2
(45) Date of Patent: Jan. 21, 2025

(54) ELECTRONIC DEVICE INCLUDING CHANNEL LAYER INCLUDING VARIABLE RESISTANCE AND METHOD OF MANUFACTURING THE SAME

(71) Applicant: SK hynix Inc., Icheon-si (KR)

(72) Inventors: Won Tae Koo, Icheon-si (KR); Jae Hyun Han, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 381 days.

(21) Appl. No.: 17/674,833

(22) Filed: Feb. 17, 2022

(65) Prior Publication Data
US 2023/0082400 A1   Mar. 16, 2023

(30) Foreign Application Priority Data
Sep. 13, 2021   (KR) .................. 10-2021-0122059

(51) Int. Cl.
*H01L 21/00*   (2006.01)
*H10N 70/00*   (2023.01)
*H10N 70/20*   (2023.01)

(52) U.S. Cl.
CPC ......... *H10N 70/253* (2023.02); *H10N 70/023* (2023.02); *H10N 70/245* (2023.02); *H10N 70/8822* (2023.02); *H10N 70/8825* (2023.02); *H10N 70/8828* (2023.02)

(58) Field of Classification Search
CPC ............ H10N 70/253; H10N 70/8822; H10N 70/8828; H10N 70/8825; H10N 70/023; H10N 70/245
See application file for complete search history.

(56) References Cited

U.S. PATENT DOCUMENTS

| | | | |
|---|---|---|---|
| 9,564,583 B2 | 2/2017 | Aratani et al. | |
| 2012/0119191 A1* | 5/2012 | Dorok | C07F 9/65583 257/E51.026 |
| 2016/0284995 A1 | 9/2016 | Bajaj et al. | |
| 2022/0271221 A1* | 8/2022 | Koo | H10N 70/24 |
| 2022/0336533 A1* | 10/2022 | Lee | H10B 63/84 |

* cited by examiner

*Primary Examiner* — Richard A Booth

(57) ABSTRACT

An electronic device includes a base element, a source electrode layer and a drain electrode layer disposed to be spaced apart from each other on the base element, a channel layer disposed between the source electrode layer and the drain electrode layer on the base element that accommodates metal ions, a metal ion conduction layer disposed on the channel layer, and a gate electrode layer disposed on the metal ion conduction layer. The channel layer includes a plurality of unit films and channel spaces between the plurality of unit films. The plurality of unit films are arranged to be parallel to a direction substantially perpendicular to a surface of the base element.

20 Claims, 16 Drawing Sheets

ELECTRONIC DEVICE INCLUDING CHANNEL LAYER INCLUDING VARIABLE RESISTANCE AND METHOD OF MANUFACTURING THE SAME

CROSS-REFERENCE TO RELATED APPLICATIONS

The present application claims priority under 35 U.S.C. § 119(a) to Korean Application No. 10-2021-0122059, filed on Sep. 13, 2021 in the Korean Intellectual Property Office, which is incorporated herein by reference in its entirety.

BACKGROUND

1. Technical Field

The present disclosure generally relates to an electronic device, and more particularly, to an electronic device including a channel layer including a variable resistance and a method of manufacturing the same.

2. Related Art

In general, in the field of electronic devices, a resistance change material may refer to a material that experiences internal electrical resistance changes when an external stimulus such as heat, pressure, voltage, or current is applied thereto. Some of the resistance change materials may maintain the changed electrical resistance in a non-volatile manner even after the external stimulus is removed. Accordingly, resistive memory devices that use changeable electrical resistance as signal information have emerged. The resistive memory devices may include, for example, a resistance change RAM, a phase change RAM, a magnetic change RAM, and the like.

Recently, with respect to the resistive memory devices, various studies for improving the performance of electronic devices are being conducted, such as increasing the number of resistance states that can be stored, increasing the identification ratio between a plurality of resistance states, increasing signal linearity and symmetry between a plurality of resistance states, and the like.

SUMMARY

An electronic device according to an embodiment of the present disclosure may include a base element, a source electrode layer and a drain electrode layer disposed to be spaced apart from each other on the base element, a channel layer, disposed between the source electrode layer and the drain electrode layer on the base element, that accommodates metal ions, a metal ion conduction layer disposed on the channel layer, and a gate electrode layer disposed on the metal ion conduction layer. The channel layer may include a plurality of unit films and channel spaces between the plurality of unit films. The plurality of unit films may be arranged to be parallel to a direction substantially perpendicular to a surface of the base element.

In a method of manufacturing an electronic device according to another embodiment of the present disclosure, a base element may be provided. A source electrode layer and a drain electrode layer may be formed to be spaced apart from each other on the base element. A metal seed layer may be formed on the base element layer. A channel layer including metal chalcogenide may be formed by reacting the metal seed layer with a chalcogen material. The channel layer may include a plurality of unit films disposed to be parallel to a direction substantially perpendicular to a surface of the base element. A metal ion conduction layer may be formed on the channel layer. A gate electrode layer may be formed on the metal ion conduction layer.

DETAILED DESCRIPTION

Figure 1:
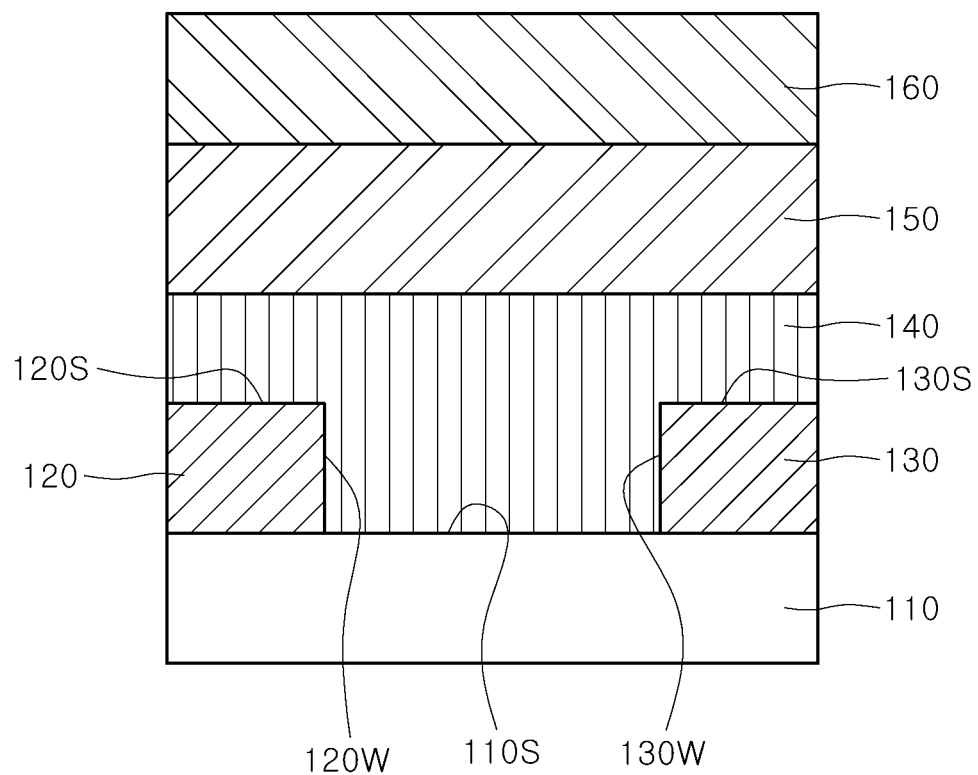
FIG. 1 is a cross-sectional view schematically illustrating an electronic device according to an embodiment of the present disclosure.
Figure 1:
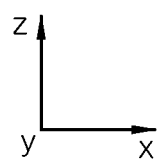

Hereinafter, embodiments of the present disclosure will be described in detail with reference to the accompanying drawings. In the drawings, in order to clearly express the components of each device, the sizes of the components, such as width and thickness of the components, are enlarged. The terms used herein may correspond to words selected in consideration of their functions in the embodiments, and the meanings of the terms may be construed to be different according to the ordinary skill in the art to which the embodiments belong. If expressly defined in detail, the terms may be construed according to the definitions. Unless otherwise defined, the terms (including technical and scientific terms) used herein have the same meaning as commonly understood by one of ordinary skill in the art to which the embodiments belong.

In addition, expression of a singular form of a word should be understood to include the plural forms of the word unless clearly used otherwise in the context. It will be understood that the terms "comprise", "include", or "have" are intended to specify the presence of a feature, a number, a step, an operation, a component, an element, a part, or combinations thereof, but not used to preclude the presence or possibility of addition one or more other features, numbers, steps, operations, components, elements, parts, or combinations thereof.

Further, in performing a method or a manufacturing method, each process constituting the method can take place differently from the stipulated order unless a specific sequence is described explicitly in the context. In other words, each process may be performed in the same manner as the stated order, and may be performed substantially at the same time. Also, at least a part of each of the above processes may be performed in a reversed order.

Figure 2A:
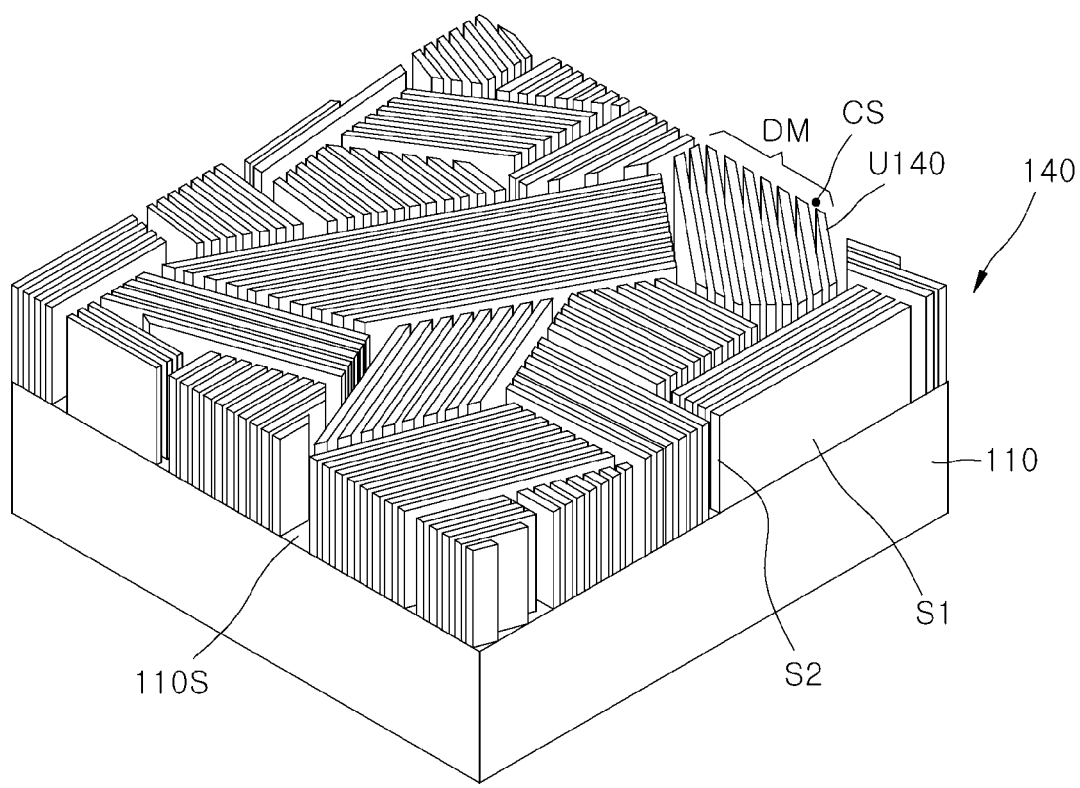
FIG. 2A is a perspective view schematically illustrating a portion of a channel layer of an electronic device according to an embodiment of the present disclosure.
Figure 2B:
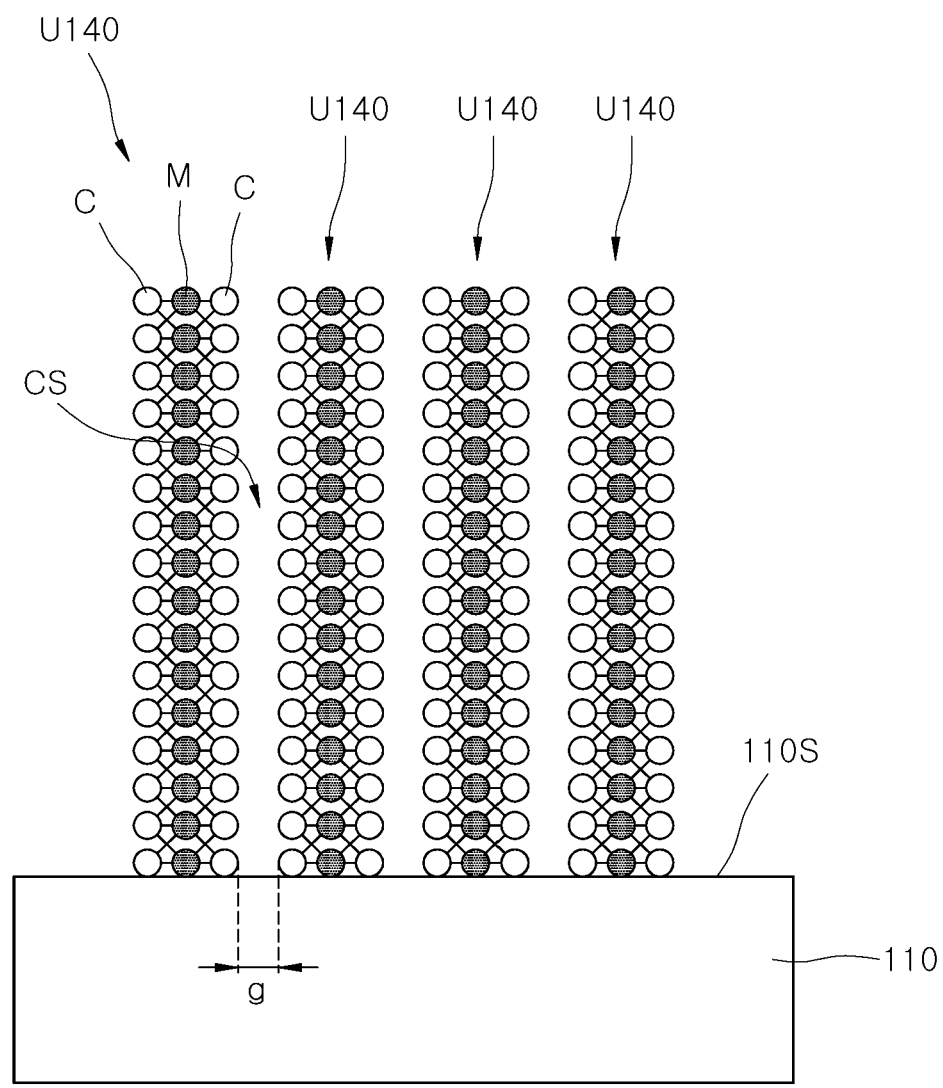
FIG. 2B is a partial cross-sectional view of unit films constituting a channel layer of an electronic device according to an embodiment of the present disclosure.
Figure 3A:
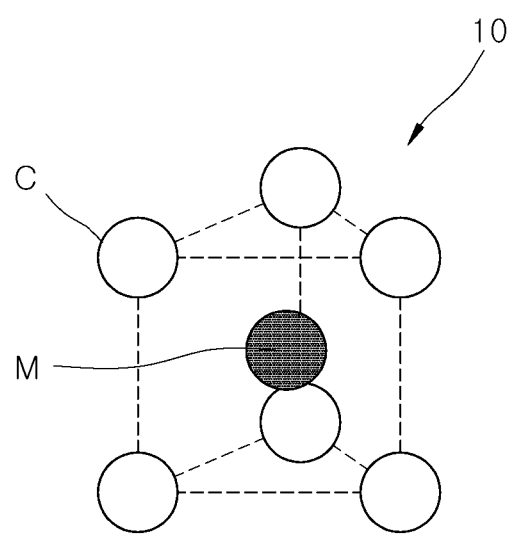
FIGS. 3A and 3B are views schematically illustrating crystal structures of a unit film constituting a channel layer of an electronic device according to an embodiment of the present disclosure.
Figure 3B:
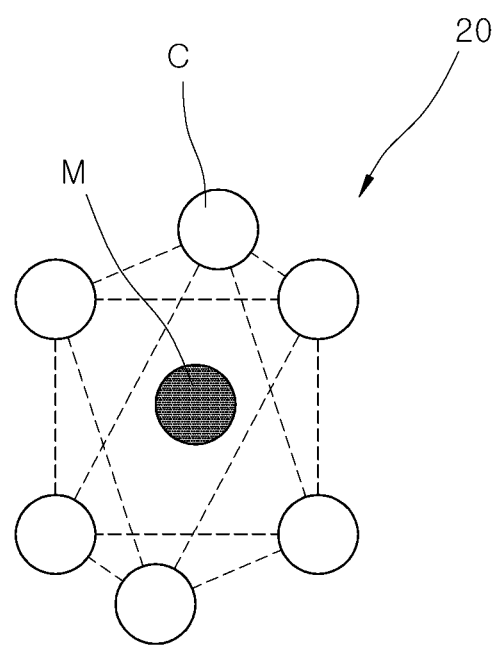

FIG. 1 is a cross-sectional view schematically illustrating an electronic device according to an embodiment of the present disclosure. FIG. 2A is a perspective view schematically illustrating a portion of a channel layer of an electronic device according to an embodiment of the present disclosure. FIG. 2B is a partial cross-sectional view of unit films constituting a channel layer of an electronic device according to an embodiment of the present disclosure. FIGS. 3A and 3B are views schematically illustrating crystal structures of a unit film constituting a channel layer of an electronic device according to an embodiment of the present disclosure.

Referring to FIG. 1, an electronic device 1 may include a base element 110. A source electrode layer 120 and a drain electrode layer 130 are disposed on the base element 110 and spaced apart from each other in an x-direction. A channel layer 140 is disposed on the base element 110 between the source electrode layer 120 and the drain electrode layer 130, a metal ion conduction layer 150 is disposed on the channel layer 140, and a gate electrode layer 160 is disposed on the metal ion conduction layer 150.

In an embodiment, the base element 110 may be a substrate. The substrate may be, for example, a semiconductor substrate, an insulating substrate, or a conductive substrate. The electrical conductivity of the substrate may be lower than the electrical conductivity of the channel layer 140. Accordingly, if the electrical conductivity of the substrate is low enough, when a voltage is applied between the source electrode layer 120 and the drain electrode layer 130 and current flows between the source electrode layer 120 and the drain electrode layer 130, the current may flow substantially more through the channel layer 110 rather than the substrate.

In another embodiment, the base element 110 may be a film having a certain thickness. The film may be disposed on a semiconductor substrate, an insulating substrate, or a conductive substrate that is not illustrated in FIG. 1 in this embodiment. The film may include, for example, a semiconductor material, an insulating material, or a conductive material. The electrical conductivity of the film may be lower than the electrical conductivity of the channel layer 140. Accordingly, if the electrical conductivity of the thin film is low enough, when a voltage is applied between the source electrode layer 120 and the drain electrode layer 130 and current flows between the source electrode layer 120 and the drain electrode layer 130, the current may flow more through the channel layer 110 than the film.

Referring to FIG. 1, the source electrode layer 120 and the drain electrode layer 130 may be disposed to be spaced apart from each other on a surface 110S of the base element 110. The surface 110S may be parallel to a plane extending in the x-direction and the y-direction. Each of the source electrode layer 120 and the drain electrode layer 130 may include a conductive material. The conductive material may include, for example, a doped semiconductor, metal, conductive metal nitride, conductive metal oxide, conductive metal silicide, conductive metal carbide, or a combination of two or more thereof. The conductive material may include, for example, silicon (Si) doped with an n-type dopant or a p-type dopant, tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

Referring to FIG. 1, the channel layer 140 may be disposed on the surface 110S of the base element 110. In an embodiment, the channel layer 140 may be disposed on the surface 110S of the base element 110 to cover an upper surface 120S and a side surface 120W of the source electrode layer 120 and to cover an upper surface 130S and a side surface 130W of the drain electrode layer 130.

Referring to FIGS. 2A and 2B, the channel layer 140 disposed on the base element 110 is illustrated. For convenience of description, components of the electronic device 1 are omitted from FIGS. 2A and 2B except for the base element 110 and the channel layer 140. The channel layer 140 may include a plurality of domains DM. Each of the domains DM may include a plurality of unit films U140 having the same orientation. In addition, each of the plurality of domains DM may include channel spaces CS between the unit films U140. Although not illustrated in FIGS. 2A and 2B, the channel spaces CS may extend from an interface between the base element 110 and the channel layer 140 to an interface between the metal ion conductive layer 150 and the channel layer 140 along the z-direction (e.g., along the vertical direction).

In the channel layer 140, a plurality of unit films U140 may be disposed to be parallel to a direction (i.e., the z-direction) that is substantially perpendicular to the surface 110S of the base element 110. Each of the plurality of unit films U140 may include a terrace surface S1 and a side surface S2 that extend parallel to the z-direction. The terrace surface S1 may have a larger surface area than the side surface S2.

In an embodiment, the plurality of unit films U140 positioned on the base element 110 and inside the same domain DM may be aligned to be parallel to each other. In addition, the channel space CS may have a gap g (illustrated in FIG. 2B) that is a distance between the terrace surfaces S1 of adjacent unit films U140. In contrast, the unit films U140 that are positioned on the base element 110 but inside different domains DM might not be aligned to be parallel to each other. For example, when viewed along the z-direction, the domains DM may have unit films at random angles to the unit films of other domains DM, or at random angles relative to a y-z plane or an x-z plane. Furthermore, the unit films U140 respectively positioned inside the neighboring or adjacent domains DM may be arranged to be spaced apart from each other to maintain a certain or minimum distance.

Referring to FIG. 2B, each of the plurality of unit films U140 may include metal chalcogenide. The metal chalcogenide may be a compound of a transition metal M and a chalcogen element C. The metal chalcogenide may have a covalent bond between the transition metal M and the chalcogen element C. In an embodiment, the metal chalcogenide may be two-dimensional transition metal dichalcogenides.

The transition metal M may include, for example, molybdenum (Mo), tungsten (W), titanium (Ti), zirconium (Zr), hafnium (Hf), vanadium (V), niobium (Nb), tantalum (Ta), technetium (Tc), rhenium (Re), iridium (Ir), nickel (Ni), palladium (Pd), platinum (Pt), or the like. The chalcogen element C may include, for example, sulfur (S), selenium (Se), tellurium (Te), or the like.

In an embodiment, the metal chalcogenide may include molybdenum disulfide ($MoS_2$), tungsten disulfide ($WS_2$), tin disulfide ($SnS_2$), molybdenum diselenide ($MoSe_2$), molybdenum ditelluride ($MoTe_2$), or a combination of two or more thereof.

Each of the plurality of unit films U140 may be a two-dimensional nanosheet. Referring to FIGS. 2A and 2B, a side surface S2 of each of the plurality of unit films U140 may be formed by combining a single chalcogen element C-a single transition metal element M-a single chalcogen element C in a chain along a direction (e.g., the x-direction) parallel to the surface 110S of the base element 110. Furthermore, in each unit film U140, covalent bonds between the transition metal M and the chalcogen element C may be formed to extend to the y-z plane to form a terrace surface S1.

In addition, coupling through van der Waals forces may result between the plurality of unit films U140. As illustrated in FIG. 2B, the channel space CS of one domain DM may have a gap g, such as for example a gap of 1 angstroms (Å) to 10 Å, between the terrace surfaces S1 of the neighboring unit films U140.

During an operation of the electronic device 1, the channel layer 140 may accommodate metal ions provided from the metal ion conduction layer 150. In addition, the channel layer 140 may supply metal ions back to the metal ion conduction layer 150. That is, the channel layer 140 and the metal ion conduction layer 150 may exchange metal ions with each other. Referring back to FIG. 1, depending on the polarity of an electric field formed between the gate electrode layer 160 and the source electrode layer 120, the metal ions may move between the channel layer 140 and the metal ion conduction layer 150.

The channel layer 140 may accommodate the metal ions in the channel spaces CS. The metal ion may include, for example, a lithium ion ($Li^+$), a sodium ion ($Na^+$), a potassium ion ($K^+$), or a combination of two or more thereof. The accommodated metal ions may be reduced and may exist in the channel spaces CS in the form of metal atoms.

The channel layer 140 may have different crystal structures depending on whether the metal ions are accommodated in the channel spaces CS. As an example, when the metal ions are not accommodated in the channel spaces CS, as illustrated in FIG. 3A, each of the unit films U140 may have a trigonal prismatic crystal structure 10. The unit film U140 having the trigonal prismatic crystal structure 10 may have, electrically, a semiconducting property. As another example, when the metal ions are accommodated in the channel spaces CS, the crystal structure may change as the channel spaces CS are expanded by the metal ions. As illustrated in FIG. 3B, the crystal structure of the unit film U140 may be converted from a triangular prismatic crystal structure 10 to an octahedral crystal structure 20. A unit film U140 having the octahedral crystal structure 20 may have, electrically, a metallic property. The crystal structure transformation of the unit film U140 may occur locally in a region of the unit film U140 adjacent to the accommodated metal ions.

The electrical resistance of the channel layer 140 may be determined according to the concentration of the metal ions accommodated in the channel layer 140. As the concentration of the metal ions accommodated in the channel layer 140 increases, the fraction of the area or volume of the unit film U140 having an octahedral crystal structure in the channel layer 140 may increase. Accordingly, as the area of the unit film U140 having a metal property increases, the electrical resistance of the channel layer 140 may decrease.

In addition, as the concentration of the metal ions accommodated in the channel layer 140 increases, the density of electrons conducting through the metal ions in the channel layer 140 may increase. For these reasons, the electrical resistance of the channel layer 140 may decrease as the concentration of the metal ions in the channel layer 140 increases.

Conversely, as the concentration of the metal ions accommodated in the channel layer 140 decreases, the size of the area or volume of the unit film U140 having the triangular prismatic crystal structure 10 may increase, and/or the density of electrons conducting through the metal ions in the channel layer 140 may decrease. Accordingly, the electrical resistance of the channel layer 140 may increase as the concentration of the metal ions in the channel layer 140 decreases.

Referring again to FIG. 1, the metal ion conduction layer 150 may be disposed on the channel layer 140. The metal ion conduction layer 150 may contact the channel layer 140. The metal ion conduction layer 150 may be disposed to be spaced apart, for example in the vertical direction, so as not to contact the source electrode layer 120 and the drain electrode layer 130.

The metal ion conduction layer 150 may include a solid electrolyte capable of accommodating metal ions. The metal ion conduction layer 150 may include, for example, lithium phosphorus oxynitride (LiPON), sulfonated tetrafluoroethylene based fluoropolymer-copolymer, polystyrene-based membranes, sulfonated polyimide (SPI)-based membranes, polyphosphazene-based membranes, polybenzimidazole (PBI)-based membranes, or the like.

The metal ion conduction layer 150 may function as a source for supplying metal ions participating in the operation of the electronic device 1. Accordingly, the metal ion conduction layer 150 may include a sufficient concentration of metal ions required for the operation of the electronic device 1. The metal ion may include, for example, a lithium ion ($L^+$), a sodium ion ($Na^+$), a potassium ion ($K^+$), or a combination of two or more thereof.

The metal ions may be provided into the metal ion conduction layer 150 when forming the metal ion conduction layer 150. As an example of the method for providing the metal ions into the metal ion conduction layer 150, a diffusion method or an ion implantation method may be applied. The metal ions may be reduced in the metal ion conduction layer 150 and may exist in the form of metal atoms. Referring back to FIG. 1, when an electric field is formed between the gate electrode layer 160 and the source electrode layer 120, the metal ion conduction layer 150 may exchange the metal ions with the channel layer 140.

Referring to FIG. 1, the gate electrode layer 160 may be disposed on the metal ion conduction layer 150. The gate electrode layer 160 may include a conductive material. The conductive material may include, for example, a doped semiconductor, metal, conductive metal oxide, conductive metal nitride, conductive metal silicide, conductive metal carbide, or a combination of two or more thereof. The conductive material may include, for example, silicon (Si) doped with an n-type or p-type dopant, tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

As described above, an electronic device according to an embodiment of the present disclosure may include a channel layer disposed between a source electrode layer and a drain electrode layer on a base element. A metal ion conduction layer may be disposed on the channel layer, and a gate electrode layer may be disposed on the metal ion conduction layer. When a voltage is applied between the gate electrode layer and the source electrode layer, the channel layer may exchange metal ions with the metal ion conduction layer. After the voltage is removed, the channel layer may have various concentrations of metal ions resulting from the metal ion exchange. The channel layer may have various different electrical resistances according to the concentration of the metal ions. In an electronic device, the channel layer may store the electrical resistance as signal information. That is, the electronic device according to an embodiment of the present disclosure may function as a memory device in which the channel layer serves as a memory layer.

Figure 4A:
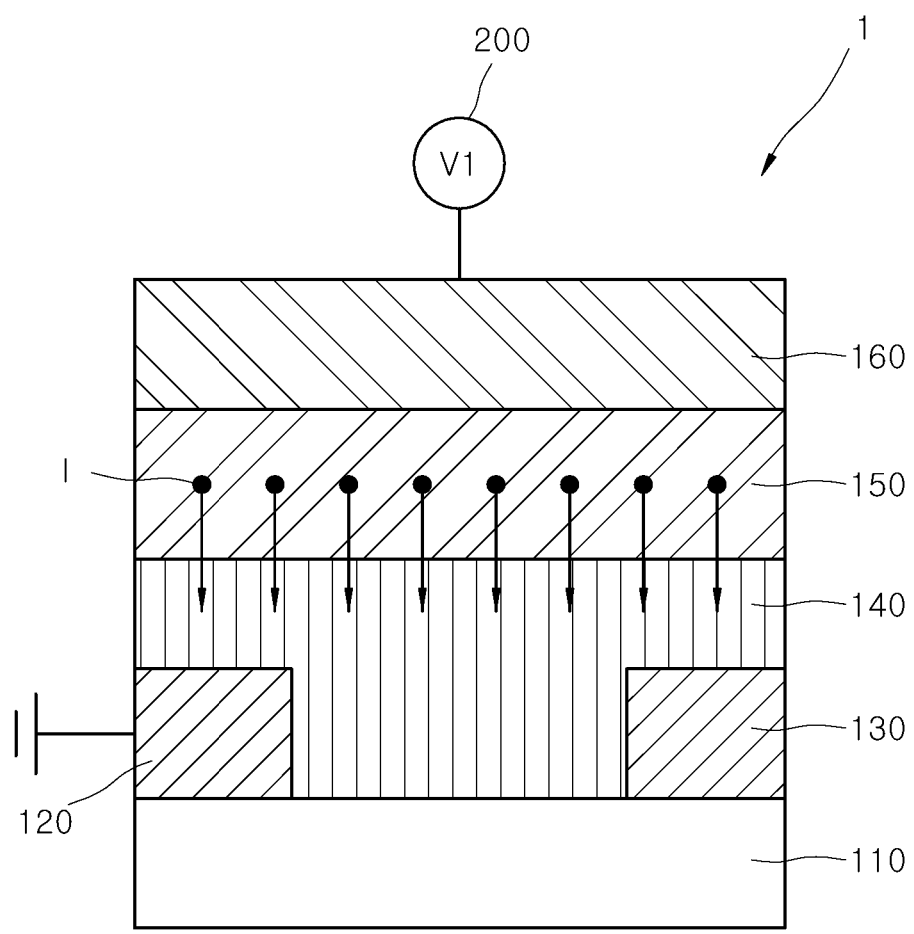
FIGS. 4A and 4B are views schematically illustrating a write operation of an electronic device according to an embodiment of the present disclosure.
Figure 4B:
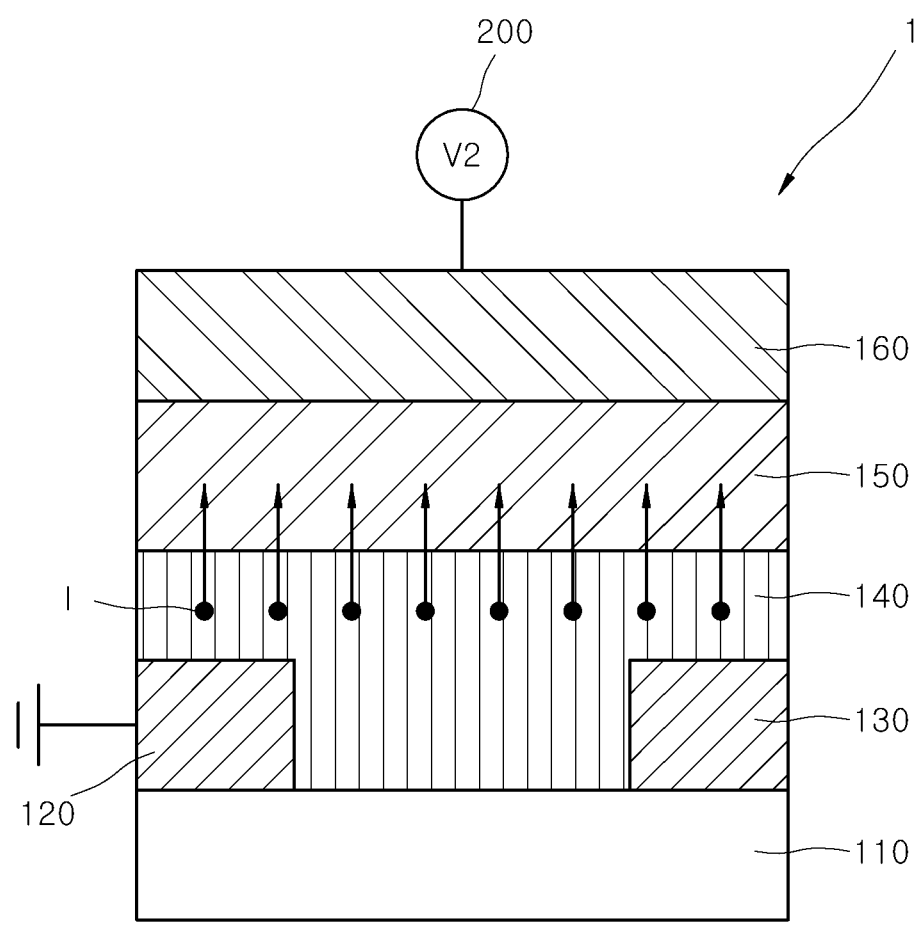
Figure 5:
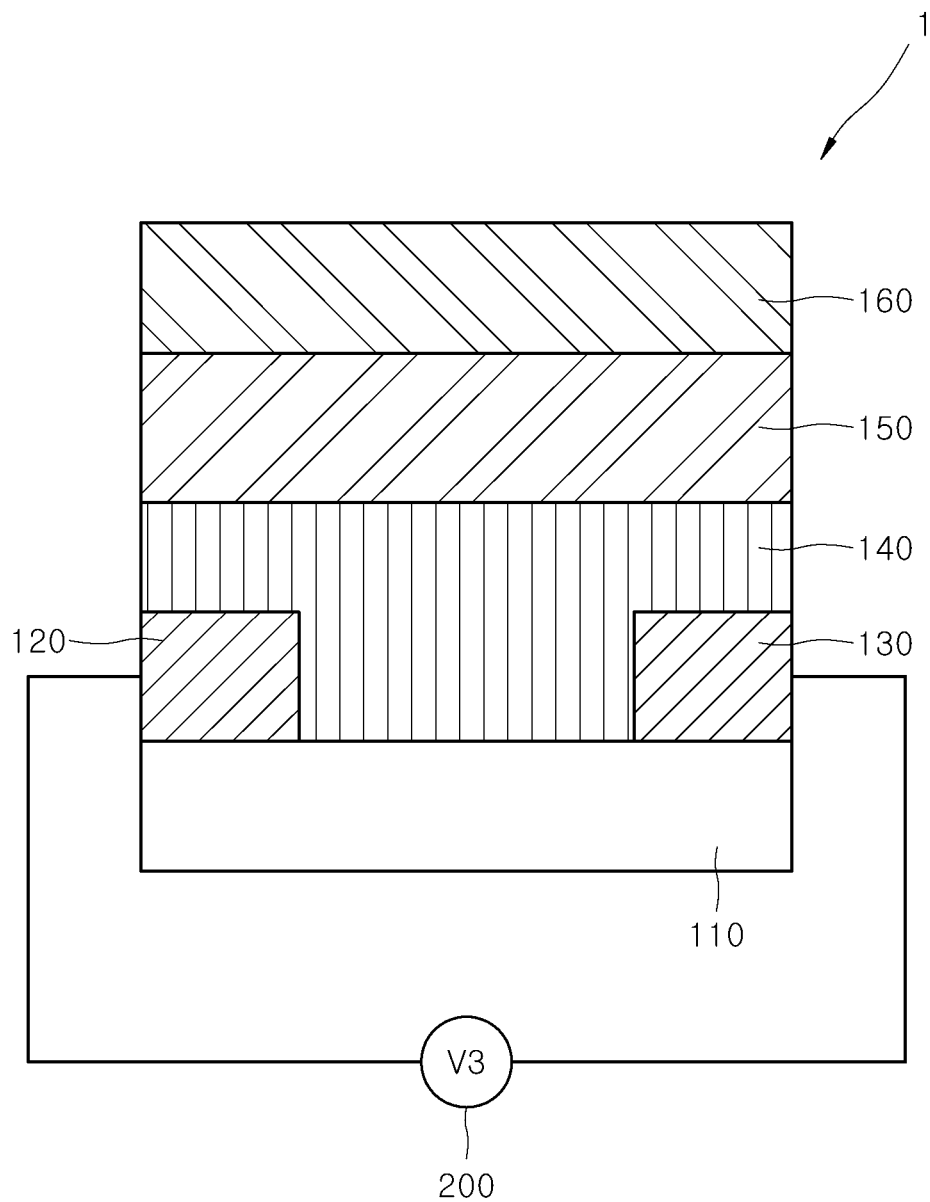
FIG. 5 is a view schematically illustrating a read operation of an electronic device according to an embodiment of the present disclosure.

FIGS. 4A and 4B are views schematically illustrating a write operation of an electronic device according to an embodiment of the present disclosure. FIG. 5 is a view schematically illustrating a read operation of an electronic device according to an embodiment of the present disclosure.

Referring to FIGS. 4A, 4B, and 5, an electronic device according to an embodiment of the present disclosure may operate as a resistance change memory device. FIG. 4A may be a view illustrating a first write operation of writing a low resistance state in a channel layer of the electronic device. FIG. 4B may be a view illustrating a second write operation of writing a high resistance state in the channel layer of the electronic device. FIG. 5 may be a view illustrating a read operation of reading a resistance state written in the channel layer of the electronic device.

Referring to FIG. 4A, a power supply 200 may be connected to an electronic device 1. The first write operation may be performed by applying a first write voltage V1 having a positive bias to a gate electrode layer 160 while a source electrode layer 120 is grounded. In another embodiment (not illustrated in FIG. 4A), a first write operation may be performed by applying a first write voltage V1 having a positive bias to a gate electrode layer 160 while a source electrode layer 120 and a drain electrode layer 130 are both grounded. In a further embodiment (not illustrated in FIG. 4A), when a base element 110 is a semiconductor substrate having conductivity, a first write operation may be performed by applying a first write voltage V1 having a positive bias to a gate electrode layer 160 while a source electrode layer 120, a drain electrode layer 130, and a base element 110 are all grounded, with the electrical conductivity of the base element 110 smaller than the electrical conductivity of a channel layer 140.

Referring again to FIG. 4A, when a first write voltage V1 having a positive bias is applied, metal ions I having a positive charge may be formed in the metal ion conduction layer 150 by oxidizing metal atoms distributed in the metal ion conduction layer 150. Subsequently, the metal ions I may be conducted to the channel layer 140 along the electric field formed by the first write voltage V1. The metal ions I conducted to the channel layer 140 may be accommodated in the channel spaces CS. The metal ions I accommodated in the channel spaces CS may be reduced and may be distributed as metal atoms in the channel spaces CS.

The concentration of the metal ions I conducted to the channel layer 140 may be adjusted by controlling the magnitude of the first write voltage V1 or by controlling the time period in which the first write voltage V1 is applied. Even after the first write voltage V1 is removed, the channel layer 140 may maintain the concentration of the metal ions I accommodated in the channel spaces CS. Accordingly, the channel layer 140 may non-volatilely store, as signal information, the electrical resistance corresponding to the concentration of the accommodated metal ions I.

In some embodiments, a first write operation may be a set operation for converting a resistance state of a channel layer 140 to a resistance state that is lower than an initial resistance state. Accordingly, a set operation may write into the channel layer 140 any of a plurality of different resistance states that correspond to different resulting metal ion I concentrations in the channel layer 140.

Referring to FIG. 4B, a second write operation may be performed by applying a second write voltage V2 having a negative bias to a gate electrode layer 160 while a source electrode layer 120 is grounded. In another embodiment not illustrated in FIG. 4B, a second write operation may be performed by applying a second write voltage V2 having a negative bias to a gate electrode layer 160 while a source electrode layer 120 and a drain electrode 130 are both grounded. In a further another embodiment not illustrated in FIG. 4B, when a base element 110 is a semiconductor substrate having conductivity, a second write operation may be performed by applying a second write voltage V2 having a negative bias to a gate electrode layer 160 while a source electrode layer 120, a drain electrode 130, and a base element 110 are all grounded, with the electrical conductivity of the base element 110 smaller than the electrical conductivity of a channel layer 140.

Referring again to FIG. 4B, when a second write voltage V2 having a negative bias is applied to the gate electrode layer 160, the metal atoms distributed in the channel layer 140 may be converted into metal ions I. The converted metal ions I may be conducted to the metal ion conduction layer 150 along an electric field formed by the second write voltage V2. The metal ions I conducted to the metal ion conduction layer 150 may be reduced and accommodated in the metal ion conduction layer 150. As the metal ions I move from the channel layer 140 to the metal ion conduction layer 150, the electrical resistance of the channel layer 140 may increase.

The concentration of the metal ions I moving from the channel layer 140 to the metal ion conduction layer 150 may be adjusted by controlling the magnitude of the second write voltage V2 or by controlling the time period during which the second write voltage V2 is applied. Even after the second write voltage V2 is removed, the channel layer 140 may maintain the changed concentration of the metal ions I. Accordingly, the channel layer 140 may non-volatilely store the electrical resistance corresponding to the changed concentration of the metal ions I as signal information.

In some embodiments, the second write operation may be a reset operation for converting a resistance state written in the channel layer 140 through a first write operation to a high resistance state, and the channel layer 140 may be returned to the initial resistance state.

Referring to FIG. 5, in order to perform a read operation of the electronic device 1, the power supply 200 may be connected to both the source electrode layer 120 and the drain electrode layer 130 of the electronic device 1. The read operation may be performed by applying a read voltage V3 between the source electrode layer 120 and the drain electrode layer 130 to read a current flowing through the channel layer 140.

As described above, through the first and second write operations, different electrical resistance states may be written in the channel layer 140. By performing the above-described read operation, signal information written in the channel layer 140 by write operations may be read.

Figure 6:
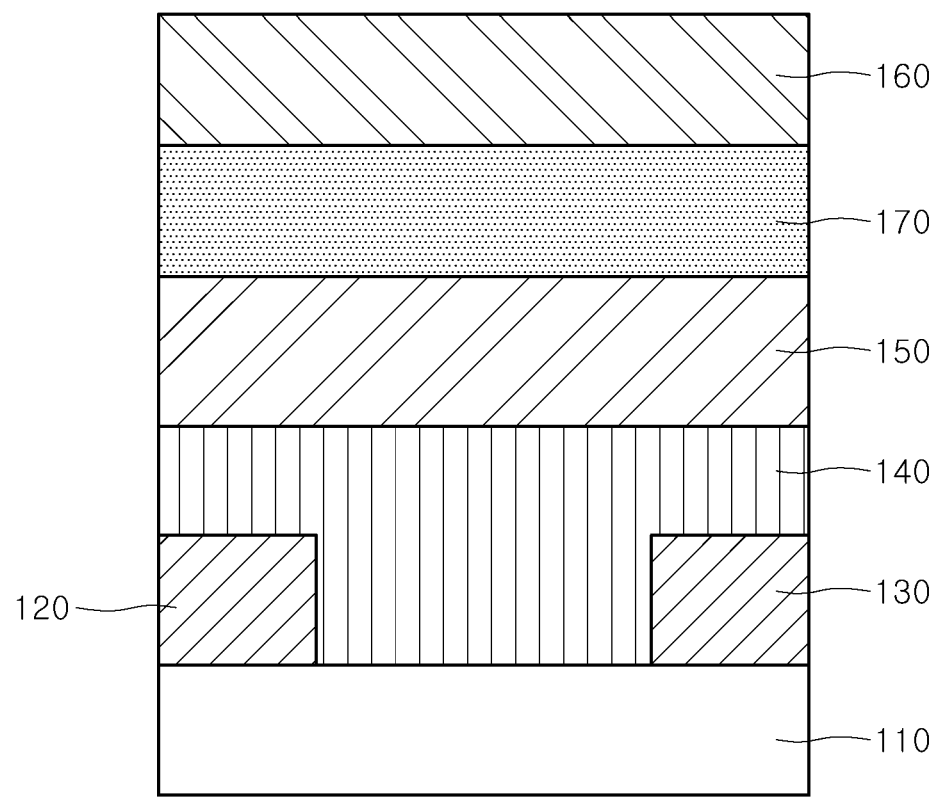
FIG. 6 is a view schematically illustrating an electronic device according to another embodiment of the present disclosure.

FIG. 6 is a view schematically illustrating an electronic device according to another embodiment of the present disclosure. Referring to FIG. 6, as compared to an electronic device 1 of FIG. 1, an electronic device 2 may further include a metal ion source layer 170 arranged between the metal ion conduction layer 150 and the gate electrode layer 160. The remaining configurations of the electronic device 2, except for the metal ion source layer 170, may be substantially the same as those of the electronic device 1 of FIG. 1.

Referring to FIG. 6, the metal ion source layer 170 may provide metal ions used in a write operation of the electronic device 2. To this end, the metal ion source layer 170 may include metal ions in a sufficient concentration required for the operations of the electronic device 2. The metal ion source layer 170 may have a higher concentration of metal ions than the metal ion conduction layer 150. The metal ion may include, for example, a lithium ion ($Li^+$), a sodium ion ($Na^+$), a potassium ion ($K^+$), or a combination of two or more thereof. The metal ion source layer 170 may include a conductive metal oxide capable of providing the metal ions.

As an example, the metal ion source layer 170 may include a metal compound having a chemical formula of $Li_xMO_2$ ($0<x\leq1$, M is titanium (Ti), vanadium (V), chromium (Cr), manganese (Mn), iron (Fe), cobalt (Co), nickel (Ni), or a combination of two or more thereof). As another example, the metal ion source layer 170 may include a metal compound having a chemical formula of $La_xMO_2$ ($0<x\leq1$, M is iron (Fe), cobalt (Co), manganese (Mn), nickel (Ni), or copper (Cu)). As another example, the metal ion source layer 170 may include $Na_x(Ni_{0.33}Fe_{0.33}Mn_{0.33})O_2(0<x\leq1)$, $Na_{1-x}Ni_{0.5}Mn_{0.5}O_2(0<x\leq1)$, $Na_2Ti_3O_7$, $Na_3V_2(PO_4)_3$, $Na_2FeP_2O_7$, $NaFePO_4$, or the like. As another example, the metal ion source layer 170 may include $K_{0.3}MnO_2$ or $K_{0.55}CoO_2$.

Referring to FIG. 6, when a voltage having a positive polarity is applied to the gate electrode layer 160, the metal ion source layer 170 may provide the metal ions to the metal ion conduction layer 150. The metal ions provided to the metal ion conduction layer 150 may be used to control the electrical resistance of the channel layer 140, as described in connection with FIGS. 4A and 4B.

Figure 7:
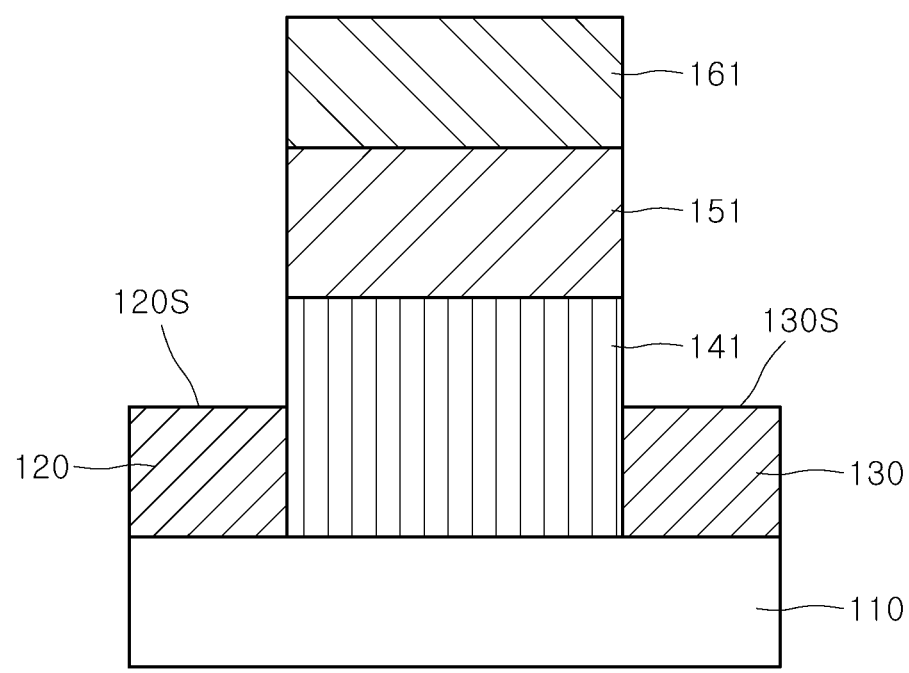
FIG. 7 is a cross-sectional view schematically illustrating an electronic device according to yet another embodiment of the present disclosure.

FIG. 7 is a cross-sectional view schematically illustrating an electronic device according to yet another embodiment of the present disclosure. Referring to FIG. 7, compared to an electronic device 1 of FIG. 1, an electronic device 3 may be different in the configurations of a channel layer 141, a metal ion conduction layer 151, and a gate electrode layer 161.

Referring to FIG. 7, an upper surface 120S of a source electrode layer 120 on a base element 110 and an upper surface 130S of a drain electrode layer 130 on a base element 110 may be exposed. The channel layer 141 may be disposed only directly over the base element 110 in the z-direction. The metal ion conduction layer 151 and the gate electrode layer 161 may be overlapped with the channel layer 141 in the z-direction. Accordingly, during a first write operation of the electronic device 3, movement of the metal ions from the metal ion conduction layer 151 to the source electrode layer 120 or the drain electrode layer 130 through the channel layer 141 may be prevented. Accordingly, the reliability of the write operation of the electronic device 3 may be improved.

Figure 8:
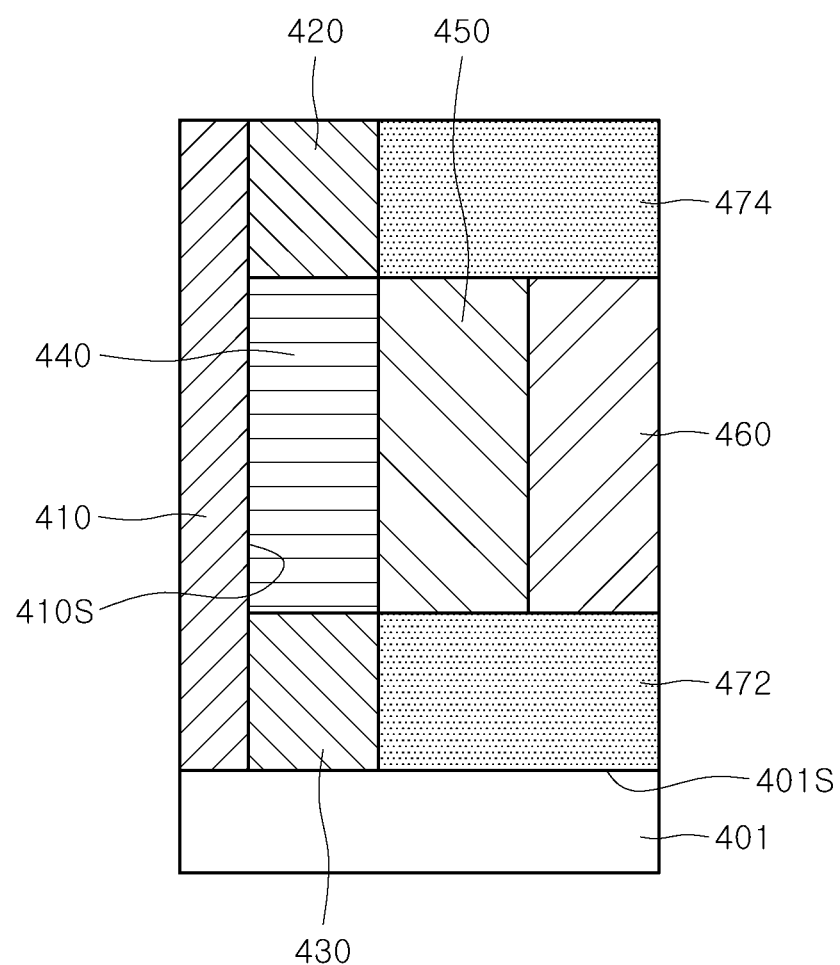
FIG. 8 is a cross-sectional view schematically illustrating an electronic device according to still yet another embodiment of the present disclosure.

FIG. 8 is a cross-sectional view schematically illustrating an electronic device according to still yet another embodiment of the present disclosure.

In FIG. 8, an electronic device 4 may include a substrate 401 having an upper surface 401S, and a base element 410, arranged on the substrate 401, that extends in a direction substantially perpendicular to the surface 401S of the substrate 401.

The substrate 401 may be a semiconductor substrate, an insulation substrate, a conductive substrate, or the like. The base element 410 may be a pattern structure disposed on the substrate 401. The pattern structure may include a semiconductor material, an insulating material, or a conductive material. The base element 410 may include a surface 410S, which is disposed on a y-z plane.

Referring to FIG. 8, a source electrode layer 420, a channel layer 440, and a drain electrode layer 430 may be disposed on or over the surface 410S of the base element 410. The source electrode layer 420 and the drain electrode layer 430 may be disposed to be spaced apart from each other in a direction (z-direction) perpendicular to the surface 401S of the substrate 401. The channel layer 440 may be disposed between the source electrode layer 420 and the drain electrode layer 430. Each of the source electrode layer 420, the channel layer 440, and the drain electrode layer 430 may be made of substantially the same material, respectively, as used in the source electrode layer 120, the channel layer 140, and the drain electrode layer 130 of FIG. 1. As an example, the channel layer 440 may include a plurality of unit films and channel spaces between the plurality of unit films, as illustrated in FIGS. 2A and 2B. The plurality of unit films may be disposed to extend from the surface 410S in a direction that is substantially perpendicular to the surface 410S of the base element 410.

Referring to FIG. 8, along the x-direction, a metal ion conduction layer 450 and a gate electrode layer 460 may be disposed on the channel layer 440. The metal ion conduction layer 450 and the gate electrode layer 460 may be made of substantially the same materials as the metal ion conduction layer 150 and the gate electrode layer 160 of FIG. 1, respectively.

Referring to FIG. 8, first and second interlayer insulation layers 472 and 474 may be disposed over the substrate 401. The first interlayer insulation layer 472 may be disposed between the substrate 401 and the metal ion conduction layer 450, and between the substrate 401 and the gate electrode layer 460. The first interlayer insulation layer 472 may be disposed to contact the drain electrode layer 430 in a lateral direction (i.e., the x-direction). The second interlayer insulation layer 474 may be disposed on the metal ion conduction layer 450 and the gate electrode layer 460. The second interlayer insulation layer 474 may be disposed to contact the source electrode layer 420 in a lateral direction (i.e., the x-direction). In this embodiment, the electronic device 4 may have the channel layer 440 extending in a direction (z-direction) perpendicular to the surface 401S of the substrate 401 as a memory layer.

As described above, according to various embodiments of the present disclosure, in an electronic device, metal ions may be exchanged between a metal ion conduction layer and a channel layer, depending on the polarity of an electric field formed between a gate electrode layer and a source electrode layer (or a drain electrode layer). Through the exchange of the metal ions, the concentration of the metal ions accommodated in the channel spaces of the channel layer may be changed. In addition, the electronic device may use the change in the electrical resistance of the channel layer that occurs according to the change in concentration of the metal ions to store signal information.

According to various embodiments of the present disclosure, because the metal ions move through the channel spaces as a fast-moving path inside the channel layer, the rate at which the metal ion concentration changes in the channel layer may be fast when an electric field is applied. Accordingly, electronic devices according to embodiments of the present disclosure may have a high driving speed. In addition, due to the high driving speed, an efficiency that channel spaces of the channel layer are filled with the metal ions or the channel spaces are emptied of the metal ions from the channel layer is improved. Accordingly, a sufficiently high on/off ratios between on/off signal information stored in the electronic device may be obtained. In addition, because the electrical conductivity of the channel layer may be determined in proportion to the concentration of the metal ion, the electronic device may be configured such that different signal information correspond linearly or symmetrically to different electrical conductivities.

FIGS. 9 to 13 are cross-sectional views schematically illustrating a method of manufacturing an electronic device according to an embodiment of the present disclosure.

Figure 9:
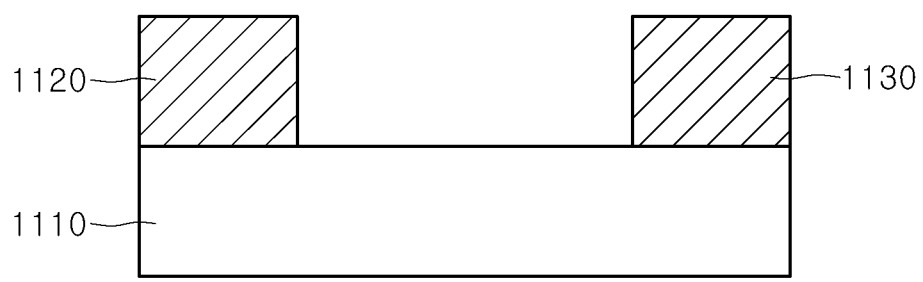
FIGS. 9 to 13 are cross-sectional views schematically illustrating a method of manufacturing an electronic device according to an embodiment of the present disclosure.

Referring to FIG. 9, a base element 1110 may be provided. The base element 1110 may be substantially the same as the base element 110 of the electronic device 1 described with reference to FIG. 1. A source electrode layer 1120 and a drain electrode layer 1130 may be formed on the base element 1100 to be spaced apart from each other. The source electrode layer 1120 and the drain electrode layer 1130 may be formed by forming a conductive film on the base element 1110 and patterning the conductive film. The conductive film may include, for example, a doped semiconductor, metal, conductive metal nitride, conductive metal oxide, conductive metal silicide, conductive metal carbide, or a combination of two or more thereof.

Figure 10:
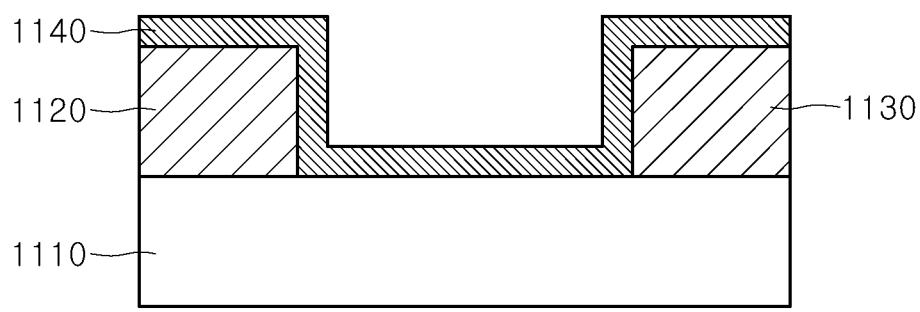

Referring to FIG. 10, a metal seed layer 1140 may be formed on the base element 1110. The metal seed layer 1140 may be formed also to cover the source electrode layer 1120 and the drain electrode layer 1130 on the base element 1110.

The metal seed layer 1140 may include transition metal. The transition metal may include, for example, molybdenum (Mo), tungsten (W), titanium (Ti), zirconium (Zr), hafnium (Hf), vanadium (V), niobium (Nb), tantalum (Ta), technetium (Tc), rhenium (Re), iridium (Ir), nickel (Ni), palladium (Pd), platinum (Pt), or a combination of two or more thereof. The metal seed layer 1140 may have a thickness of 1 nanometer (nm) to 10 nanometers (nm). The metal seed layer 1140 may be formed by applying, for example, chemical vapor deposition, atomic layer deposition, physical vapor deposition, or the like.

Figure 11:
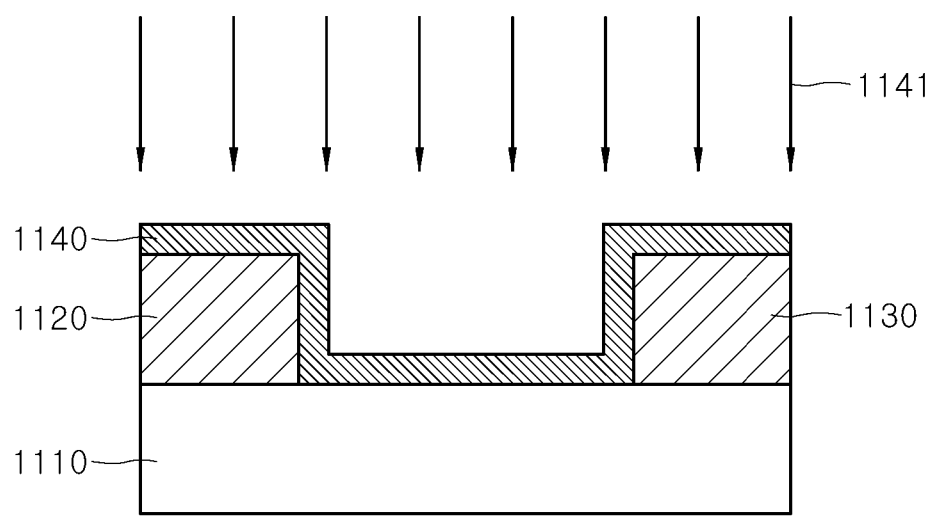

Referring to FIG. 11, vapor 1141 of a chalcogen material may be provided to the metal seed layer 1140. The chalcogen material may include sulfur (S), selenium (Se), tellurium (Te), or the like. The process of providing the vapor 1141 of the chalcogen material may proceed as follows.

In an embodiment, a solid chalcogen material may be prepared. Then, heat may be applied to the chalcogen material to vaporize the chalcogen material. Subsequently, the vapor 1141 of the vaporized chalcogen material may be provided to the metal seed layer 1140.

Figure 12:
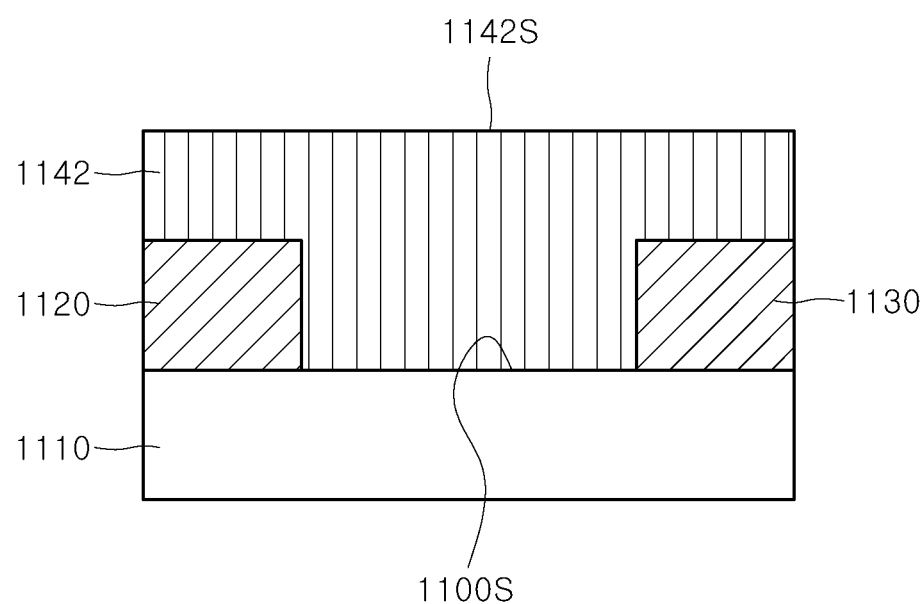

Referring to FIG. 12, the metal seed layer 1140 and the vapor 1141 of the chalcogen material may be reacted to form a channel layer 1142 including metal chalcogenide. The channel layer 1142 may be formed to include a plurality of unit films that are disposed parallel to a direction substantially perpendicular to a surface 1100S of the base element 1110. The plurality of unit films may be disposed to be spaced apart from each other in a direction parallel to the surface 1100S of the base element 1110.

In an embodiment, the process of forming the channel layer 1142 may include growing a plurality of two-dimensional nanosheets extending in a direction substantially perpendicular to the surface 1100S of the base element 1110. The configuration of the channel layer 1142 may be substantially the same as the configuration of the channel layer 140 described with reference to FIGS. 2A and 2B.

In an embodiment, after the reaction of the metal seed layer 1140 and the vapor 1141 of the chalcogen material is finished, a process of planarizing an upper surface 1142S of the channel layer 1142 may be additionally performed. For the planarization process, as an example, a physical and chemical polishing method may be applied.

Figure 13:
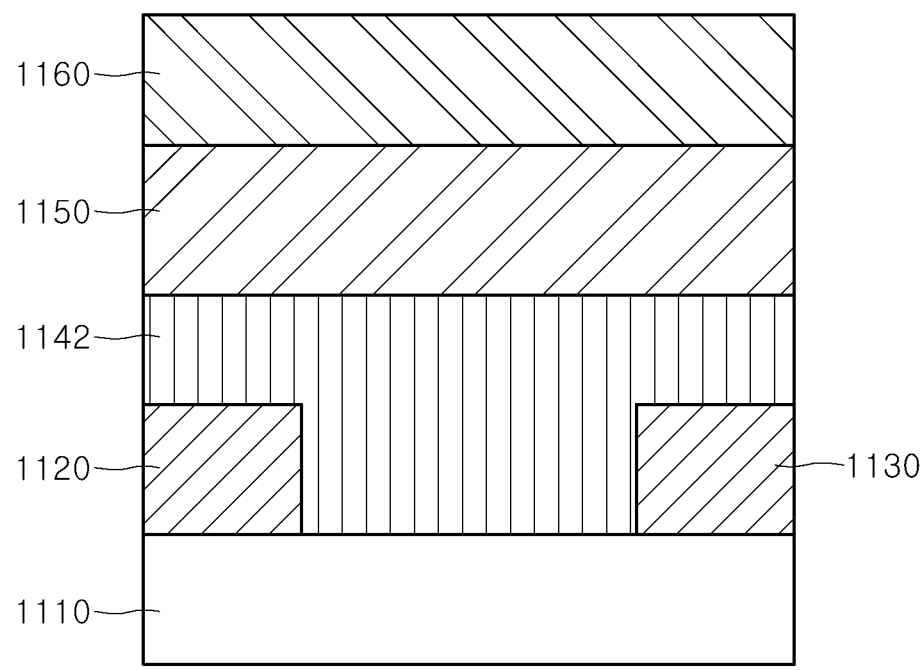

Referring to FIG. 13, a metal ion conduction layer 1150 may be formed on the channel layer 1142. The metal ion conduction layer 1150 may include a solid electrolyte capable of accommodating metal ions. The metal ion may include at least one selected from the group consisting of a lithium ion ($Li^+$), a sodium ion ($Na^+$), and a potassium ion ($K^+$). The metal ion conduction layer 1150 may be formed by chemically synthesizing the solid electrolyte and coating the synthesized solid electrolyte on the channel layer 1142.

Then, a gate electrode layer 1160 may be formed on the metal ion conduction layer 1150. The gate electrode layer 1160 may include a conductive material. The conductive material may include, for example, a doped semiconductor, metal, conductive metal oxide, conductive metal nitride, conductive metal silicide, conductive metal carbide, or a combination of two or more thereof. A method of forming the gate electrode layer 1160 may include, for example, chemical vapor deposition, physical vapor deposition, atomic layer deposition, or the like.

Through the above-described methods, electronic devices according to embodiments of the present disclosure may be manufactured. For example, the manufactured electronic device may be the electronic device 1 described above with reference to FIG. 1.

In some embodiments, after forming the metal ion conduction layer 1150, a metal ion source layer may be additionally formed on the metal ion conduction layer 1150.

The metal ion source layer may be formed by chemically synthesizing conductive metal oxide including at least one of lithium ions, sodium ions, and potassium ions, and coating the synthesized conductive metal oxide on the metal ion conduction layer 1150.

Subsequently, the gate electrode layer 1160 may be formed on the metal ion source layer. Accordingly, an electronic device 2 described with reference to FIG. 6 may be manufactured.

In some embodiments, when forming the metal seed layer 1140 in connection with FIG. 10, the metal seed layer 1140 may be formed only on the surface of the base element 1110. Accordingly, in FIG. 12, the channel layer 1142 might not be formed directly on the source electrode layer 1120 and the drain electrode layer 1130. In this manner, an electronic device 3 described with reference to FIG. 7 may be manufactured.

The manufacturing method according to an embodiment of the present disclosure may be substantially equally applied to a structure in which the base element is vertically disposed on the underlying substrate. Accordingly, an electronic device 4 described above with reference to FIG. 8 may be manufactured.

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. An electronic device comprising;
   a base element;
   a source electrode layer and a drain electrode layer disposed to be spaced apart from each other on the base element;
   a channel layer, disposed between the source electrode layer and the drain electrode layer on the base element, that accommodates metal ions;
   a metal ion conduction layer disposed on the channel layer; and
   a gate electrode layer disposed on the metal ion conduction layer,
   wherein the channel layer comprises a plurality of unit films and channel spaces between the plurality of unit films, and
   wherein the plurality of unit films are disposed to be parallel to a direction substantially perpendicular to a surface of the base element.

2. The electronic device of claim 1, wherein each of the plurality of unit films comprises metal chalcogenide.

3. The electronic device of claim 2, wherein the metal chalcogenide comprises at least one selected from the group consisting of molybdenum disulfide ($MoS_2$), tungsten disulfide ($WS_2$), tin disulfide ($SnS_2$), molybdenum diselenide ($MoSe_2$), and molybdenum ditelluride ($MoTe_2$).

4. The electronic device of claim 1, wherein each of the plurality of unit films is a two-dimensional nanosheet.

5. The electronic device of claim 1, wherein the channel spaces extend from an interface between the base element and the channel layer to an interface between the metal ion conduction layer and the channel layer.

6. The electronic device of claim 1, wherein each of the channel spaces is between 1 Å to 10 Å.

7. The electronic device of claim 1, wherein the channel layer and the metal ion conduction layer are configured to exchange metal ions with each other.

8. The electronic device of claim 7, wherein the channel layer has different crystal structures depending on the metal ions accommodated in the channel spaces.

9. The electronic device of claim 7, wherein the channel layer is configured to have an electrical resistance that decreases as the metal ions accommodated in the channel spaces increase.

10. The electronic device of claim 1, wherein the metal ion conduction layer comprises a solid electrolyte that accommodates metal ions.

11. The electronic device of claim 10, wherein the metal ions comprise at least one selected from the group consisting of a lithium ion, a sodium ion, and a potassium ion.

12. The electronic device of claim 1, further comprising a metal ion source layer disposed between the metal ion conduction layer and the gate electrode layer.

13. The electronic device of claim 12, wherein the metal ion source layer comprises conductive metal oxide that provides at least one of a lithium ion, a sodium ion, and a potassium ion.

14. The electronic device of claim 1, wherein the channel layer stores a signal information as an electrical resistance that changes according to a concentration of the metal ions.

15. A method of manufacturing an electronic device, the method comprising:
   providing a base element;
   forming a source electrode layer and a drain electrode layer disposed to be spaced apart from each other on the base element;
   forming a metal seed layer on the base element layer;
   forming a channel layer comprising metal chalcogenide by reacting the metal seed layer with a chalcogen material, the channel layer comprising a plurality of unit films disposed to be parallel to a direction substantially perpendicular to a surface of the base element;
   forming a metal ion conduction layer on the channel layer; and
   forming a gate electrode layer on the metal ion conduction layer.

16. The method of claim 15, wherein the metal seed layer comprises one selected from the group consisting of molybdenum (Mo), tungsten (W), titanium (Ti), zirconium (Zr), hafnium (Hf), vanadium (V), niobium (Nb), tantalum (Ta), technetium (Tc), rhenium (Re), iridium (Ir), nickel (Ni), palladium (Pd), and platinum (Pt).

17. The method of claim 15, wherein forming the channel layer comprises:
   providing vapor of one of sulfur (S), selenium (Se), tellurium (Te) to the metal seed layer; and
   reacting the vapor of the one of sulfur (S), selenium (Se), tellurium (Te) with the metal seed layer to grow the plurality of unit films on the base element.

18. The method of claim 15, wherein forming the channel layer comprises growing a plurality of two-dimensional nanosheets extending in a direction substantially perpendicular to the surface of the base element.

19. The method of claim 15,
   wherein the metal ion conduction layer comprises a solid electrolyte that accommodates metal ions, and
   wherein the metal ions comprise one selected from the group consisting of a lithium ion, a sodium ion, and a potassium ion.

20. The method of claim 15, further comprising forming a metal ion source layer disposed between the metal ion conduction layer and the gate electrode layer,
   wherein the metal ion source layer comprises conductive metal oxide including at least one of a lithium ion, a sodium ion, and a potassium ion.

* * * * *